United States Patent [19]

Buck

[11] Patent Number: 5,327,107
[45] Date of Patent: Jul. 5, 1994

[54] ELECTRICAL APPARATUS WITH DIGITALLY SET TRANSFER FUNCTION

[75] Inventor: Brian J. Buck, Northampton, England

[73] Assignee: GEC-Marconi Limited, United Kingdom

[21] Appl. No.: 950,804

[22] Filed: Sep. 24, 1992

[30] Foreign Application Priority Data

Nov. 25, 1991 [GB] United Kingdom ............... 9124974

[51] Int. Cl.⁵ .................................................. H03H 7/20
[52] U.S. Cl. ....................................... 333/139; 333/156
[58] Field of Search ......................... 333/138–140, 333/156–164; 307/511, 262; 342/371, 372, 374, 375; 377/43

[56] References Cited

U.S. PATENT DOCUMENTS

| | | | |
|---|---|---|---|
| 3,725,686 | 4/1973 | Ustach | 235/156 |
| 4,063,250 | 12/1977 | Fenwick | 333/156 |
| 4,549,152 | 10/1985 | Kumar | 333/164 X |
| 4,599,585 | 7/1986 | Vorhaus et al. | 333/161 X |
| 4,841,552 | 6/1989 | Kingston | 377/43 |
| 4,994,773 | 2/1991 | Chen et al. | 333/164 |
| 5,180,998 | 1/1993 | Willems | 333/164 |

*Primary Examiner*—Seungsook Ham
*Attorney, Agent, or Firm*—Kirschstein, Ottinger, Israel & Schiffmiller

[57] ABSTRACT

An electrical apparatus has a number of units (1 to 6), each of which is capable of presenting a transfer function of a different value to an input signal. It also includes control circuitry (7, 9) whereby a desired selection of units (1 to 6) can be made so as to present to the input signal a total value of desired transfer function. The values of the units are chosen such that the ratio (B) between a function value and the next smaller value is less than 2:1.

6 Claims, 1 Drawing Sheet

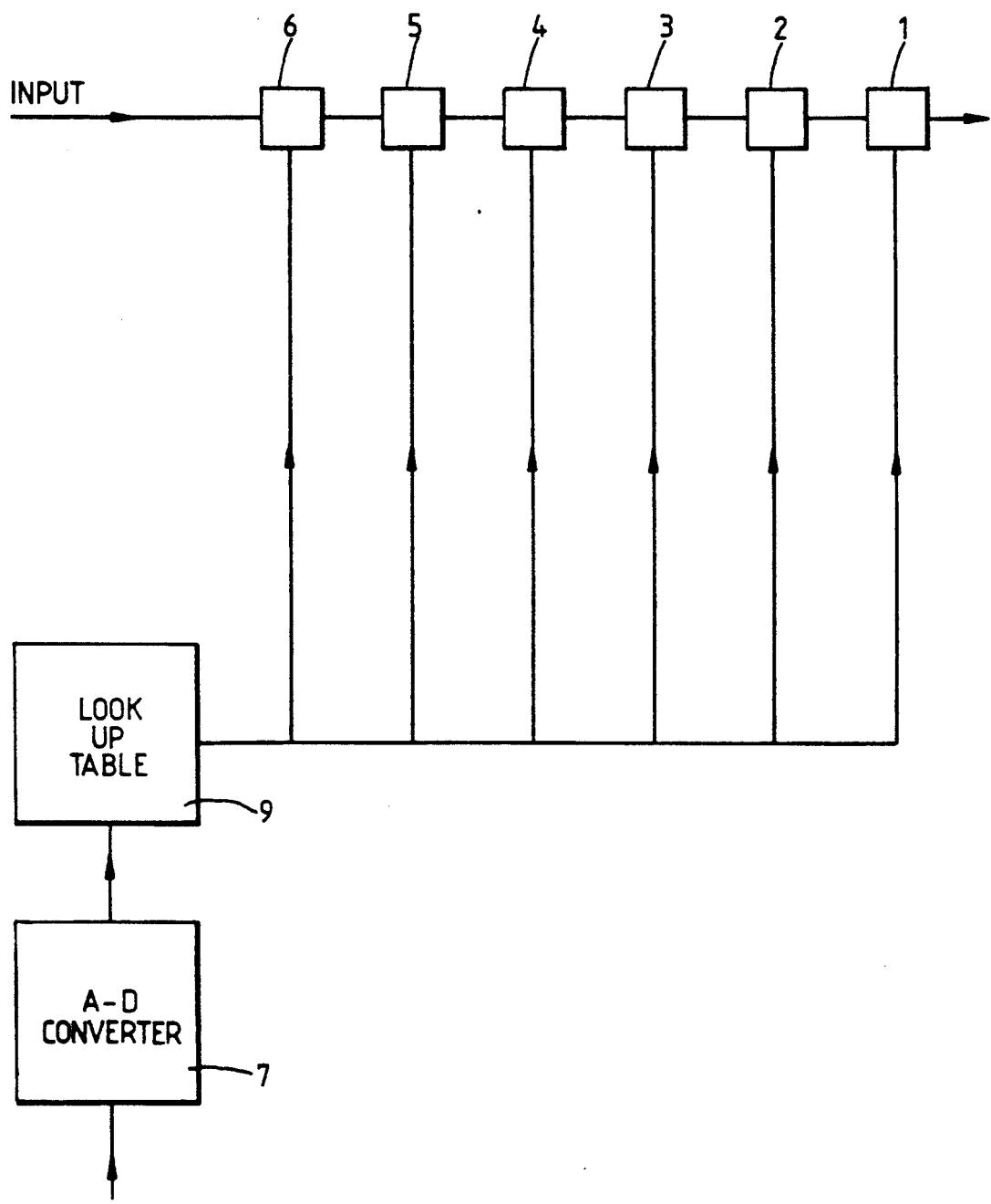

ELECTRICAL APPARATUS WITH DIGITALLY SET TRANSFER FUNCTION

BACKGROUND OF THE INVENTION

1. Field of the Invention

This invention relates to electrical apparatus.

More particularly the invention relates to electrical apparatus of the kind (hereinafter referred to as the kind specified) comprising a number of units, each of which is capable of presenting to an input signal a transfer function of a different value and control means whereby a desired selection of said units can be made so as to present to the input signal a total value of desired transfer function value within a predetermined range.

2. Description of the Related Art

In such an apparatus the control means typically provides a binary control signal, each digit of which determines whether or not a different one of the unit is selected according to the value of that digit i.e. whether that digit has a value '0' or '1'.

The control signal is suitably produced by an analogue to digital convertor which produces a binary digital output signal in response to an analogue input signal representing the desired total value of said transfer function to a resolution, i.e. number of digits, equal to the number of said units.

One example of such an apparatus is a phase shifter which comprises a number of units each of which imposes a different phase shift on the input signal. In such an apparatus the values of the transfer functions presented by the different units are chosen so that any desired value within the given range of values of the transfer function can be obtained with at least a predetermined accuracy i.e. resolution. To this end in a known form of apparatus of the kind specified the values of the transfer functions presented by the units are chosen so that the available settable total values of the transfer functions are equally spaced through the desired range. In such an arrangement the unit presenting the largest value of transfer function presents a transfer function equal to half the desired range, a second unit presents a transfer function of half this value and so on, the unit presenting the smallest value of transfer function presenting a value equal to or less than the desired resolution. For example for a phase shifter settable in the range 0° to 360° using five units and have a five digit binary number as the control signal the phase shifts of the different units are 180°, 90°, 45°, 22.5° and 11.25°. With such an arrangement any desired value within the range 0° to 360° can be obtained with a maximum resolution of 11.25°. However, in practice the actual phase shifts presented by the different units are likely also to be subject to error. As a result the actual maximum resolution is larger than 11.25°. For example if each unit is subject to the same percentage error and the unit giving the largest phase shift is high and the other units are all low a large gap in obtainable values exists between that obtained when all but the highest phase shift unit is selected (i.e. control signal 01111) and that obtained which only the unit giving the largest phase shift (MSB) is selected (i.e. control signal 10000).

SUMMARY OF THE INVENTION

It is an object of the present invention to provide an electrical apparatus of the kind specified wherein this problem is alleviated.

According to the present invention there is provided an electrical apparatus of the kind hereinbefore specified characterised in that the ratio between each transfer function value and the next smaller transfer function value is less than 2:1.

BRIEF DESCRIPTION OF THE DRAWINGS

The invention will now be further explained and one embodiment of apparatus in accordance with the invention described with reference to the accompanying figure which is a schematic diagram of a phase shifter according to the invention.

DETAILED DESCRIPTION OF THE PREFERRED EMBODIMENT

The theoretical basis for the invention will now be explained, with reference to a phase shifter, by way of example.

Considering a phase shifter comprising n units, each of which imposes a different phase shift $B_i$ on an input signal, where $0 < i < n-1$. The minimum phase shift value (LSB) is $B_o$ and the maximum phase shift value (MSB) is $B_{n-1}$.

The phase shifter is designed to produce phase shifts within the range R with a predetermined accuracy of at least L.

The resolution L which can be achieved is determined by the LSB. Where the error in each phase shift value is $\partial$, the value of the LSB varies between $B_o(1+\partial)$ and $$\frac{B_o}{1+\partial}$$

where $B_o$ is the nominal value.

For maximum resolution $$L = B_o(1+\partial) \qquad (1)$$

The sum of all the phase shifts $B_i$ {where $0 < i < n-1$} must not be less than the range R of phase shifts to be produced, even when each phase shift has its minimum value, $$\frac{B_i}{1+\partial}.$$

$$R = \sum_{i=0}^{n-1} \frac{B_i}{1+\partial} \qquad 2$$

Since each phase shift is related to the next smallest phase shift by the ratio $\beta:1$ $$B_i = \beta \cdot B_{i-1} = \beta^i \cdot B_o \qquad (3)$$

Substituting in (2)

$$R = \frac{B_o}{1+\partial} \sum_{i=0}^{n-1} \beta^i$$

Substituting using (1)

$$R = \frac{L}{(1+\partial)^2} \sum_{i=0}^{n-1} \beta^i = \frac{L}{(1+\partial)^2} \cdot \frac{\beta^n - 1}{\beta - 1} \qquad 4$$

When the MSB is a maximum ($B_{n-1} \cdot (1+\partial)$) and the other units have a minimum value $$\frac{(Bi)}{(1+\partial)},$$

the difference between the MSB and the sum of the other units must not exceed the resolution L $$B_{n-1}(1+\partial) - \sum_{i=0}^{n-2} \frac{Bi}{1+\partial} = L \quad \text{5}$$

From ③

$$(1+\partial)\beta^{n-1} \cdot B_o - \frac{B_o}{1+\partial} \sum_{i=0}^{n-2} \beta^i = L \quad \text{6}$$

and from ①

$$L \cdot \beta^{n-1} - \frac{L}{(1+\partial)^2} \sum_{i=0}^{n-2} \beta^i = L \quad \text{7}$$

$$\beta^{n-1} - \frac{1}{(1+\partial)^2} \cdot \frac{\beta^{n-1}-1}{\beta-1} = 1 \quad \text{8}$$

Rearranging $$(\beta^{n-1}-1)\left[1 - \frac{1}{(1+\partial)^2} \cdot \frac{1}{\beta-1}\right] = 0 \quad \text{9}$$

$$\therefore (1+\partial)^2 (\beta - 1) = 1 \quad \text{10}$$

Substituting in ④

$$R = L(\beta^n - 1) \quad \text{11}$$

$$\beta = \sqrt[n]{1 + \frac{R}{L}} \quad \text{12}$$

Equations 10 and 12 are used to calculate the phase shift ratio $\beta$ and R/L for a given error $\partial$. or the ratio $\beta$ and tolerable error $\partial$ for a given R/L As shown below, for n=6

|     | ∂ (%) | β    | R/L  |
|-----|-------|------|------|
|     | 0     | 2.00 | 63   |
|     | 5     | 1.91 | 47.1 |
|     | 10    | 1.83 | 36.1 |
|     | 15    | 1.76 | 28.3 |
|     | 20    | 1.69 | 22.7 |
|     | 25    | 1.64 | 18.5 |
| and | R/L   | β    | ∂ (%)|
|     | 63    | 2.00 | 0    |
|     | 50    | 1.93 | 4    |
|     | 40    | 1.86 | 8    |
|     | 31    | 1.78 | 13   |

The figures of $\beta$ given above are accurate only to two decimal places.

One phase shifter according to the invention will now be described by way of example only.

Referring to the figure, the phase shifter includes a control means comprising a circuit 7 and a look-up table 9. The circuit 7 receives an analogue signal representative of a desired phase shift to be presented to an input signal by units 1 to 6, each of which present a different phase shift value.

The circuit 7 is an analogue to digital converter, which passes a five digit binary signal to the look-up table 9.

In the look-up table 9, for each five digit signals, that combination of the six available phase shift values which most closely corresponds to the desired phase shift is selected.

The phase shifter is designed to present a total phase shift of between 0° and 360°−L to the input signal and $$R/L = \frac{360° - L}{L}$$

To achieve the same precision as would be achieved using five units in a conventional binary phase shifter with 0% error, the ratio R/L must equal 32.

Thus the resolution $$L = \frac{360}{32}$$

and the LSB is 10° if the percentage error to be tolerated is 13% from equation ①

In this case $$\beta = \sqrt[6]{32} \doteq 1.78$$

so that the six phase shift values are approximately 10°, 17.8°, 31.7°, 56.6°, 101° and 180°.

Thus according to the invention, a phase shifter capable of presenting the above phase shift values to an input signal can produce a total phase shift of between 0° and 360° to the same resolution as would be achieved with a five unit phase shifter with 0% error, even if the percentage error in each phase shift value is 13%.

I claim:

1. An electrical apparatus comprising: a number of units, each of which, when selected, presents to an input signal a transfer function of a different fixed value; and control means for making a selection of said units so as to present to the input signal a desired total transfer function value within a predetermined range, the ratio between each transfer function value and the next smaller transfer function value being less than 2:1.

2. An apparatus as claimed in claim 1 wherein said ratio of the selected units has the same value for each adjacent pair of transfer functions.

3. An apparatus as claimed in claim 1 wherein the value of the largest transfer function of the selected units is chosen to equal the median value of said range.

4. An apparatus as claimed in claim 2 wherein the ratio of the selected units is:

$$\sqrt[n]{1 + \frac{R}{L}} :1$$

where
n is the number of units
R is the range of values to be produced and
L is a desired resolution.

5. An apparatus as claimed in claim 2 wherein the value of the largest transfer function of the selected units is chosen to equal the median value of said range.

6. An apparatus as claimed in claim 1 wherein said transfer function of the selected units is a phase shift.

* * * * *